United States Patent
Dobbins et al.

(10) Patent No.: US 9,676,649 B2
(45) Date of Patent: Jun. 13, 2017

(54) GLASS SUBSTRATES WITH STRATEGICALLY IMPRINTED B-SIDE FEATURES AND METHODS FOR MANUFACTURING THE SAME

(75) Inventors: Michael Sean Dobbins, Painted Post, NY (US); James Robert Lim, Painted Post, NY (US); Hung Cheng (Henry) Lu, Ithaca, NY (US); Wanda Janina Walczak, Big Flats, NY (US); Liming Wang, Painted Post, NY (US); Ruchirej Yongsunthon, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 1236 days.

(21) Appl. No.: 13/218,932

(22) Filed: Aug. 26, 2011

(65) Prior Publication Data

US 2013/0052414 A1 Feb. 28, 2013

(51) Int. Cl.
  *B32B 3/30* (2006.01)
  *C03B 17/06* (2006.01)
  (Continued)

(52) U.S. Cl.
  CPC ............ *C03B 17/065* (2013.01); *C03C 19/00* (2013.01); *H01L 29/78603* (2013.01);
  (Continued)

(58) Field of Classification Search
  USPC ........................................................ 428/141
  See application file for complete search history.

(56) References Cited

U.S. PATENT DOCUMENTS 2,999,013 A 9/1961 Meth ................................. 41/42
3,554,725 A 1/1971 Bracken et al.
(Continued)

FOREIGN PATENT DOCUMENTS

DE 102008063554 A1 6/2010
TW 200720204 6/2007
(Continued)

OTHER PUBLICATIONS

JPO Website Machine English Translation of JP 2005-255478, Miwa, Shinikichi, Sep. 22, 2005.*
(Continued)

*Primary Examiner* — Laura Auer
(74) *Attorney, Agent, or Firm* — Thomas R. Beall; Matthew J. Mason; Jeffrey A. Schmidt

(57) ABSTRACT

Glass substrates and methods for forming glass substrates are disclosed. The glass substrates include a planar A-side surface having a surface roughness $Ra_1$ of less than 0.5 nm and a planar B-side having a surface roughness $Ra_2$ wherein the ratio $Ra_2:Ra_1$ is greater than or equal to about 1.5. A plurality of texturing features are formed in the B-side surface. The plurality of texturing features have a peak-to-valley height H such that $0.05~\mu m \leq H \leq 3.75~\mu m$. The texturing features are distributed in the B-side surface such that a center-to-center pitch P between adjacent texturing features is at least 1.5 mm in at least one direction. The plurality of texturing features are formed in the B-side surface while the glass substrate is at a temperature T1, wherein $600°~C. \leq T1 \leq 1200°~C.$ and a viscosity of the glass substrate is from greater than 150,000 Poise and less than $10^{13}$ Poise.

17 Claims, 10 Drawing Sheets

(51) Int. Cl.
*C03B 23/02* (2006.01)
*C03C 19/00* (2006.01)
*H01L 29/786* (2006.01)
*G02F 1/1333* (2006.01)

(52) U.S. Cl.
CPC .......... *C03C 2204/08* (2013.01); *G02F 2001/133302* (2013.01); *G02F 2201/50* (2013.01); *Y02P 40/57* (2015.11); *Y10T 428/24355* (2015.01)

(56) References Cited

U.S. PATENT DOCUMENTS

| | | | |
|---|---|---|---|
| 3,672,859 A | 6/1972 | Classen | 65/93 |
| 3,951,633 A | 4/1976 | Danihel | |
| 4,664,748 A | 5/1987 | Ueno et al. | 156/659 |
| 5,119,258 A | 6/1992 | Tsai et al. | 360/135 |
| 5,242,544 A | 9/1993 | Itoh et al. | 156/659.1 |
| 5,493,123 A | 2/1996 | Knollenberg et al. | |
| 5,792,327 A | 8/1998 | Belscher et al. | 204/192.15 |
| 6,350,506 B2 | 2/2002 | Dickinson, Jr. | 428/156 |
| 6,420,647 B1 | 7/2002 | Ji et al. | 136/259 |
| 6,538,195 B1 | 3/2003 | Shi et al. | 136/259 |
| 6,550,278 B2 | 4/2003 | Mitani et al. | |
| 6,796,146 B2 | 9/2004 | Burnham | |
| 6,818,308 B2 | 11/2004 | Kase et al. | 428/426 |
| 6,997,018 B2 | 2/2006 | Sakoske et al. | |
| 7,666,508 B2 | 2/2010 | Feng et al. | 428/409 |
| 7,685,840 B2 | 3/2010 | Allaire et al. | 65/29.12 |
| 7,818,980 B2 | 10/2010 | Burdette et al. | 65/90 |
| 2007/0116913 A1 | 5/2007 | Kimura et al. | 428/38 |
| 2009/0162623 A1 | 6/2009 | Foresti et al. | |
| 2010/0279067 A1 | 11/2010 | Sabia et al. | |
| 2010/0279068 A1 | 11/2010 | Cook et al. | |
| 2010/0285275 A1 | 11/2010 | Baca et al. | |
| 2012/0058306 A1 | 3/2012 | Miwa et al. | |
| 2012/0202010 A1 | 8/2012 | Uchida | |
| 2014/0008340 A1* | 1/2014 | Urata et al. | 219/121.76 |

FOREIGN PATENT DOCUMENTS

| | | |
|---|---|---|
| TW | 201114713 A | 5/2011 |
| WO | 2010141832 A1 | 12/2010 |
| WO | 2010141846 A1 | 12/2010 |

OTHER PUBLICATIONS

JPO Website Machine English Translation of JP 2004-012544, Shimada, Naoyuki, Jan. 15, 2004.*
K. Robinson, et al., "Electrostatic Issues in Roll-to-Roll Manufacturing Operations", *IEEE Transactions on Industry Applications*, Nov./Dec. 2010, vol. 46, No. 6, pp. 2172-2178.
CN201280051745X First Office Action Dated December 1, 2015 Chinese Patent Office, China.
International Search Report of the International Searching Authority; PCT/US2012/052210; Mailed November 8, 2012, 5 Pages; European Patent Office.
JP2014527319 Notice of Rejection Dated Jun. 14, 2016, Japanese Patent Office, Japan.
TW101130677 Search Report Dated Jan. 5, 2016, 1 Page; Taiwan Patent Office.

* cited by examiner

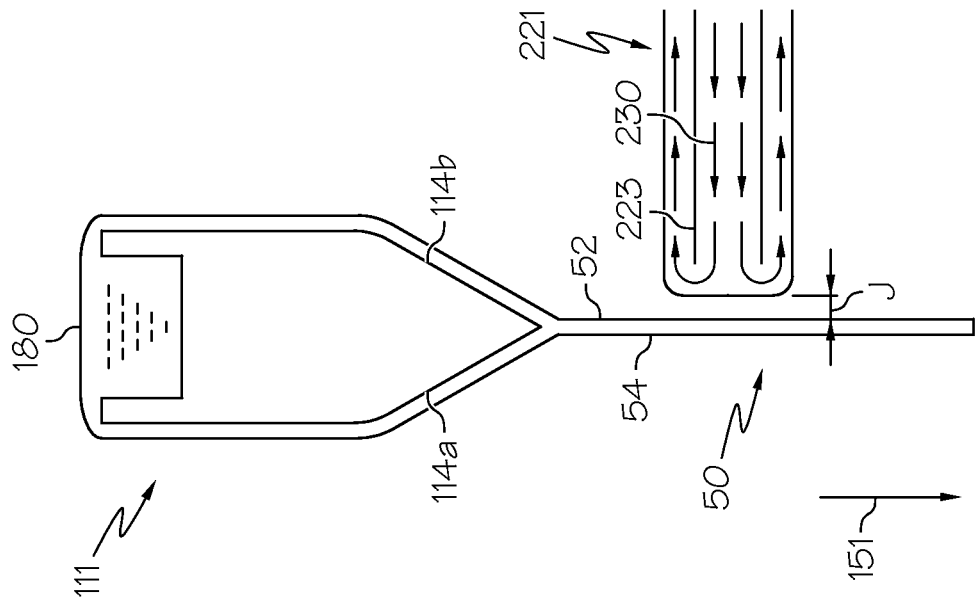
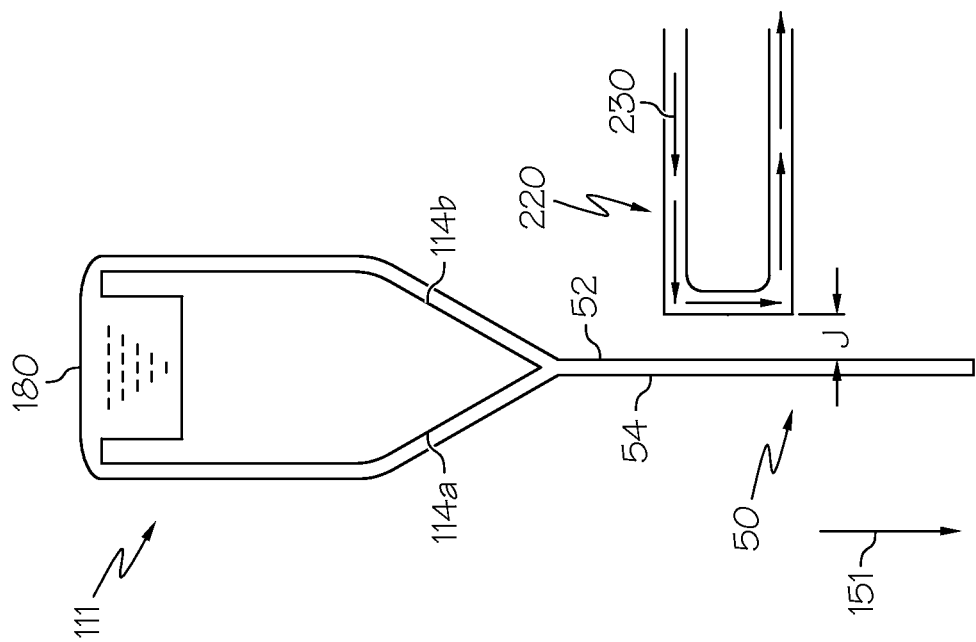

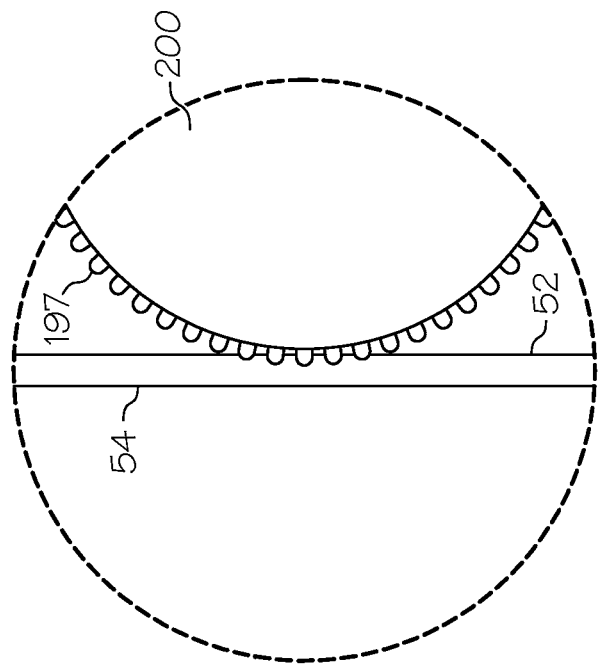
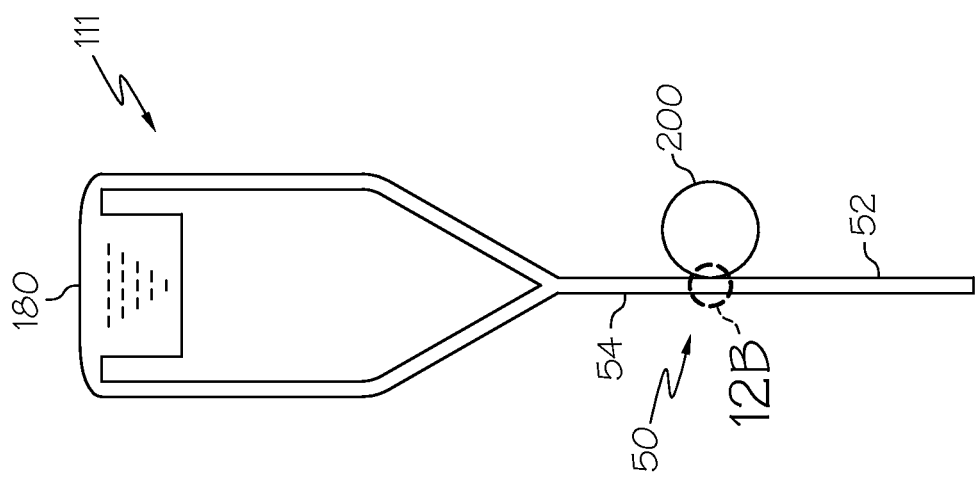
FIG. 13B
FIG. 13A

GLASS SUBSTRATES WITH STRATEGICALLY IMPRINTED B-SIDE FEATURES AND METHODS FOR MANUFACTURING THE SAME

BACKGROUND

Field

The present specification generally relates to glass substrates for use in display devices and, more specifically, to glass substrates with strategically imprinted B-side texturing features for reducing charge generation and methods for manufacturing the same.

Technical Background

Thin glass substrates are commonly utilized in flat panel display devices such as thin-film-transistor liquid crystal displays (TFT-LCDs). Substrates used in TFT-LCDs generally have a functional A-side surface on which the thin-film transistors are deposited and a non-functional backside or B-side surface which opposes the A-side surface. During manufacture of the TFT-LCD device, the B-side surface of the glass substrate may come into contact with conveyance and handling equipment formed from a variety of materials, including metals, ceramics, polymeric materials and the like. The friction between these dissimilar materials results in triboelectrification or contact electrification and, as a result, charge is transferred to the glass surface and accumulates on the surface of the glass substrate. As charge accumulates on the surface of the glass substrate, the surface voltage of the glass substrate also increases.

Electrostatic charging of B-side surfaces of glass substrates used in TFT-LCDs may degrade the performance of the glass substrate and/or damage the glass substrate. For example, electrostatic charging of the B-side surface may cause gate damage to the TFT devices deposited on the A-side surface of the glass substrate through dielectric breakdown. Moreover, charging of the B-side surface of the glass substrate may attract particles to the A-side surface, such as dust or other particulate debris, which may damage the glass substrate or degrade the surface quality of the glass substrate. In either circumstance, electrostatic charging of the glass substrate may decrease TFT-LCD manufacturing yields thereby increasing the overall cost of the TFT-LCD manufacturing process.

Further, frictional contact between the glass substrate and handling and/or conveyance equipment may cause the handling and conveyance equipment to wear thereby reducing the service life of the equipment. Repair or replacement of worn equipment results in process down-time, decreasing manufacturing yields and increasing the overall costs of the TFT-LCD manufacturing process.

Accordingly, a need exists for alternative designs for glass substrates which mitigate the generation of charge and decrease the friction between the glass substrates and equipment utilized in the manufacture of TFT-LCD display devices.

SUMMARY

Several aspects of the present invention are disclosed herein. It is to be understood that these aspects may or may not overlap with one another. Thus, part of one aspect may fall within the scope of another aspect, and vice versa.

Each aspect is illustrated by a number of embodiments, which in turn, can include one or more specific embodiments. It is to be understood that the embodiments may or may not overlap with each other. Thus, part of one embodiment, or specific embodiments thereof, may or may not fall within the ambit of another, or specific embodiments thereof, and vice versa.

Thus, a first aspect of the present disclosure is related to a glass substrate comprising:

a planar A-side surface having a surface roughness $Ra_1$ of less than 0.5 nm;

a planar B-side surface opposed to the A-side surface, the B-side surface comprising:

a surface roughness $Ra_2$ such that a ratio $Ra_2:Ra_1$ is greater than or equal to about 1.5;

a plurality of texturing features formed in the B-side surface such that the texturing features extend from the B-side surface into a thickness S of the glass substrate without extending through the thickness S of the glass substrate, the plurality of texturing features having a peak-to-valley height H such that 0.05 µm≤H≤3.75 µm; and a center-to-center pitch P between adjacent texturing features is at least 1.5 mm in at least one direction.

In certain embodiments of the first aspect of the present disclosure, 0.05 µm≤H≤2.0 µm.

In certain embodiments of the first aspect of the present disclosure, H≤0.04*S.

In certain embodiments of the first aspect of the present disclosure, the center-to-center pitch P between adjacent texturing features is less than or equal to 25 mm.

In certain embodiments of the first aspect of the present disclosure, the B-side surface of the glass substrate has a planar area A and a contact surface area C, wherein C≤0.5*A.

In certain embodiments of the first aspect of the present disclosure, 1.5≤$Ra_2:Ra_1$≤100.

In certain embodiments of the first aspect of the present disclosure, the B-side surface of the glass substrate is free from surface defects having a defect size greater than 100 µm.

A second aspect of the present disclosure relates to a method for forming a glass substrate, the method comprising:

melting glass batch materials to form molten glass;

forming the molten glass into a glass substrate having a planar A-side surface and a planar B-side surface opposed to the A-side surface, wherein the glass substrate is formed without mechanically contacting at least the A-side surface prior to the glass substrate solidifying to a viscosity greater than $10^{13}$ Poise, wherein the planar A-side surface has a surface roughness $Ra_1$ of less than 0.5 nm after solidification;

drawing the glass substrate in a downward direction;

forming a plurality of texturing features into the B-side surface of the glass substrate while the glass substrate is at a temperature T1, wherein:

600° C.≤T1≤1200° C.;

the texturing features extend from the B-side surface into a thickness of the glass substrate without extending through the thickness of the glass substrate;

the plurality of texturing features have a peak-to-valley height H such that 0.05 µm≤H≤3.75 µm;

a center-to-center pitch P between adjacent texturing features is at least 1.5 mm in at least one direction; and the B-side surface has a surface roughness $Ra_2$ such that a ratio $Ra_2:Ra_1$ is greater than or equal to about 1.5.

In certain embodiments of the second aspect of the present disclosure, the plurality of texturing features have a first size D1 while the glass substrate is at the temperature T1 and a second size D2 when the glass substrate is cooled to room temperature, wherein D1>D2.

In certain embodiments of the second aspect of the present disclosure, the texturing features are formed by selectively drawing heat from the surface of the glass substrate as the glass substrate is drawn in the downward direction.

In certain embodiments of the second aspect of the present disclosure, the plurality of texturing features are imprinted into the B-side surface of the glass substrate by directing at least one stream of compressed gas onto the B-side surface of the glass substrate as the glass substrate is drawn in the downward direction.

In certain embodiments of the second aspect of the present disclosure, the plurality of texturing features are imprinted into the B-side surface of the glass substrate by contacting the B-side surface of the glass substrate with a texturing roller, wherein at least a portion of a contact surface of the texturing roller comprises a plurality of patterning features corresponding to the texturing features imprinted on the B-side surface.

In certain embodiments of the second aspect of the present disclosure, a temperature T2 of the texturing roller is actively controlled such that T2<T1.

In certain embodiments of the second aspect of the present disclosure, the texturing roller is stationary and the B-side surface of the glass substrate is tangential to the contact surface of the texturing roller when the B-side surface of the glass substrate contacts the contact surface of the texturing roller.

In certain embodiments of the second aspect of the present disclosure, the texturing roller is stationary and the B-side surface of the glass substrate is directed over the contact surface of the texturing roller such that the B-side surface has a contact angle with the contact surface of up to about 90°.

In certain embodiments of the second aspect of the present disclosure, the texturing roller is actively rotated as the glass substrate is drawn in the downward direction with pulling rollers.

In certain embodiments of the second aspect of the present disclosure, the glass substrate is formed by flowing the molten glass over only one side of an isopipe and the plurality of texturing features are formed by directing the glass substrate onto a landing extending from a root of the isopipe as the glass substrate is drawn in the downward direction, wherein the molten glass contacting the landing forms the texturing features in B-side surface of the glass substrate.

In certain embodiments of the second aspect of the present disclosure, at least a portion of a contact surface of the landing comprises a plurality of patterning features corresponding to the texturing features imprinted into the B-side surface.

In certain embodiments of the second aspect of the present disclosure, the landing comprises active heating elements that maintain the viscosity of the glass substrate as the glass substrate is directed over the landing.

In certain embodiments of the second aspect of the present disclosure, the glass substrate is formed by flowing the molten glass over a first side of an isopipe and a second side of the isopipe such that the molten glass rejoins at a root of the isopipe, wherein the second side of the isopipe comprises a plurality of patterning features corresponding to the texturing features imprinted into the B-side surface of the glass substrate and the plurality of texturing features are formed in the B-side surface of the glass substrate as the molten glass flows over the second side of the isopipe and the patterning features disrupt the flow of molten glass over the second side of the isopipe.

In certain embodiments of the second aspect of the present disclosure, the plurality of texturing features are formed in the B-side surface of the glass substrate by directing a beam of at least one laser source onto the B-side surface of the glass substrate such that the beam of the at least one laser source imprints the plurality of texturing features into the B-side surface of the glass substrate without ablating glass from the glass substrate as the glass substrate is drawn in the downward direction.

A third aspect of the present disclosure relates to a method for forming a glass substrate, the method comprising:

melting glass batch materials to form molten glass;

forming the molten glass into a glass substrate having a planar A-side surface and a planar B-side surface opposed to the A-side surface, wherein the glass substrate is formed without mechanically contacting either the A-side surface or the B-side surface prior to the glass substrate solidifying to a viscosity of $10^{13}$ Poise;

drawing the glass substrate in a downward direction; and directing a beam of at least one laser source onto the B-side surface of the glass substrate while the glass substrate is at a temperature T1 in a range $600°\,C. \leq T1 \leq 1200°\,C.$ such that the beam of the at least one laser source imprints a plurality of texturing features into the B-side surface of the glass substrate as the glass substrate is drawn in the downward direction, wherein the texturing features extend from the B-side surface into a thickness of the glass substrate without extending through the thickness of the glass substrate.

In certain embodiments of the second aspect of the present disclosure, the plurality of texturing features have a peak-to-valley height H such that $0.05\ \mu m \leq H \leq 3.75\ \mu m$.

In certain embodiments of the second aspect of the present disclosure, the planar A-side surface has a surface roughness $Ra_1$ of less than 0.5 nm and the B-side surface has a surface roughness $Ra_2$ such that a ratio $Ra_2:Ra_1$ is greater than or equal to about 1.5.

In certain embodiments of the second aspect of the present disclosure, a center-to-center pitch P between adjacent texturing features is at least 1.5 mm in at least one direction.

Additional features and advantages of the glass substrates and methods for producing the glass substrates will be set forth in the detailed description which follows, and in part will be readily apparent to those skilled in the art from that description or recognized by practicing the embodiments described herein, including the detailed description which follows, the claims, as well as the appended drawings.

It is to be understood that both the foregoing general description and the following detailed description describe various embodiments and are intended to provide an overview or framework for understanding the nature and character of the claimed subject matter. The accompanying drawings are included to provide a further understanding of the various embodiments, and are incorporated into and constitute a part of this specification. The drawings illustrate the various embodiments described herein, and together with the description serve to explain the principles and operations of the claimed subject matter.

BRIEF DESCRIPTION OF THE DRAWINGS

FIGS. 10A and 10B schematically depicts the formation of texturing features in the B-side surface of a glass substrate by selectively drawing heat from the B-side surface of the glass substrate;

FIGS. 13A, 13B and 13C schematically depict the formation of texturing features in the B-side surface of a glass substrate with a stationary texturing roller having patterning features.

DETAILED DESCRIPTION

Figure 1:
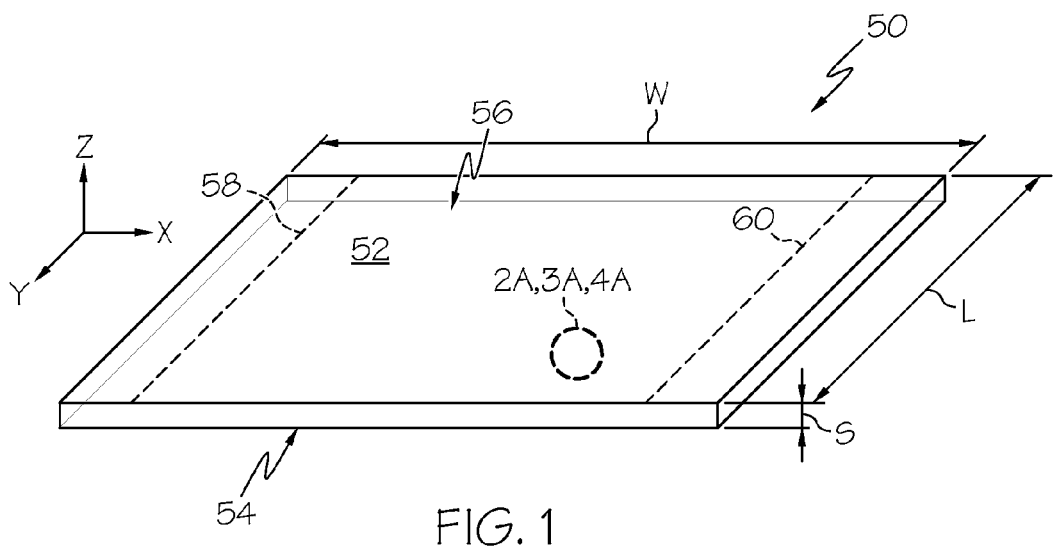
FIG. 1 schematically depicts a glass substrate according to one or more embodiments shown and described herein.

Reference will now be made in detail to embodiments of glass substrates with strategically imprinted texturing features on the B-side surfaces of the glass substrates and methods for manufacturing the same, examples of which are illustrated in the accompanying drawings. Whenever possible, the same reference numerals will be used throughout the drawings to refer to the same or like parts. One embodiment of a glass substrate with strategically imprinted texturing features imprinted on the B-side surface of the glass substrate is schematically depicted in FIG. 1. The glass substrate generally includes a planar A-side surface and a planar B-side surface positioned opposite the A-side surface. The A-side surface has a surface roughness $Ra_1$ of less than 0.5 nm while the B-side surface has a surface roughness $Ra_2$ such that a ratio $Ra_2:Ra_1$ is greater than or equal to about 1.5. A plurality of texturing features are formed in the B-side surface such that the texturing features have a peak to valley height H in the range from about 0.05 μm to 3.75 μm. A center to center pitch between adjacent texturing features is at least 1.5 mm in at least one direction. The glass substrates and various methods for forming the glass substrates will be described in more detail herein with specific reference to the appended drawings.

As noted hereinabove, the B-side surfaces of glass substrates may come into contact with various conveyance and handling equipment formed from a variety of materials, including metals, ceramics, and/or polymeric materials. The friction between these dissimilar materials results in triboelectrification or contact electrification and, as a result, charge is transferred to the glass surface and accumulates on the surface of the glass substrate. Specifically, two dissimilar materials charge from contact separation due to the differences in the intrinsic work function values of the respective materials. As charge accumulates on the surface of the glass substrate, the surface voltage of the glass substrate also increases according to the relationship:

$$V = \frac{Q}{C} \quad (1)$$

where V is the surface voltage, Q is the charge, and C is the capacitance.

Moreover, when two charged surfaces separate, the capacitance C between the charged surfaces decreases according to the relationship:

$$C = \frac{\varepsilon A}{4\pi d} \quad (2)$$

where A is the surface area, ε is the dielectric constant and d is the separation distance. Combining equations (1) and (2), as the capacitance decreases with increasing separation distance between the two surfaces, the voltage on the surface of the glass substrate increases which, in turn, may lead to a higher propensity for damage to TFT devices formed on the glass substrate. The glass substrates described herein mitigate the generation of charge due to contact with dissimilar materials through the use of strategically imprinted texturing features in the B-side surface of the glass substrate which reduce the surface contact area between the glass substrate and any material with which the glass substrate comes into contact.

Referring now to FIG. 1, a glass substrate 50 is schematically depicted. The glass substrate 50 generally comprises a planar A-side surface 54 and a planar B-side surface 52 opposite the A-side surface 54. The glass substrate 50 has a gross surface area A which is defined by the edge dimensions (i.e., the length L and width W or similar dimensions) of the glass substrate. The glass substrate 50 has a thickness S which is generally less than or equal to about 3 mm. In some embodiments, the thickness of the glass substrate 50 may be less than or equal to about 3 mm and greater than or equal to about 100 µm. In other embodiments, the thickness S of the glass substrate 50 may be less than or equal to about 3 mm and greater than or equal to about 0.3 mm. In still other embodiments, the thickness S of the glass substrate 50 may be less than or equal to about 3 mm and greater than or equal to about 0.7 mm. In yet other embodiments, the thickness of the glass substrate 50 may be less than or equal to about 0.7 mm and greater than or equal to about 0.3 mm.

In some embodiments, the glass substrate 50 may include a central quality area 56 which has improved physical properties relative to edge bands 58, 60 of the glass substrate (i.e., the central quality area may be substantially defect free and have improved surface roughness characteristics and/or flatness characteristics). In the embodiment of the glass substrate 50 shown in FIG. 1, the quality area 56 of the glass substrate is the central area of the glass substrate between edge bands 58, 60. In some embodiments, the glass substrate may also comprise lateral edge bands (i.e., edge bands that extend in the direction of the width W) which, in conjunction with edge bands 58,60, frame the quality area 56 of the glass substrate 50.

As noted hereinabove, the glass substrate 50 may be used in a flat panel display device. Specifically, the glass substrate 50 may be used as a substrate on which thin-film-transistors are deposited on the A-side surface 54 to form a liquid crystal display. To facilitate the desired optical properties of the resultant display device, the A-side surface 54 generally has a surface roughness $Ra_1$ which is less than about 0.5 nm in a 2 µm×2 µm area. In some embodiments, the A-side surface has a surface roughness $Ra_1$ which is less than about 0.4 nm or even less than about 0.3 nm in a 2 µm×2 µm area. In some other embodiments, the A-side surface has a surface roughness $Ra_1$ which is about 0.2 nm in a 2 µm×2 µm area. In some embodiments, the A-side surface 54 of the glass substrate 50 also has a flatness of less than about 20 nm/10 mm.

Moreover, the A-side surface generally has less than 0.01 particles/cm$^2$, such as debris, glass particles or the like, with a particle size greater than or equal to 1.0 µm. Similarly, the A-side surface has less than or equal to 0.004 particles/m$^2$ of adhered glass particles with a particle size of greater than or equal to 30 µm.

In the embodiments described herein, the glass substrate generally has a warp of less than or equal to 0.40 mm over an edge distance of less than or equal to 400 mm and a warp of less than or equal to 0.1% of the edge distance for edge distances greater than 400 mm. Similarly, the glass substrate generally has a waviness cutoff over a length from about 0.8 mm to 8 mm of less than or equal to 0.06 µm and a waviness cutoff over a length from about 0.8 mm to about 25 mm of less than or equal to 0.33 µm.

The charging effects of the glass substrate are related to the surface resistivity of the glass substrate. Specifically, the surface resistivity of the glass substrate directly impacts charge dissipation. In general glass substrates with lower surface resistivity experience less charging than glass substrates with relatively higher surface resistivities. In the embodiments described herein, the glass substrates have surface resistivities in a range from about $10^{10}$ ohm/sq to about $10^{22}$ ohm/sq.

Still referring to FIG. 1, the B-side surface 52 of the glass substrate 50 generally has a surface roughness $Ra_2$ which is greater than or equal to the surface roughness $Ra_1$ of the A-side surface 54. In some embodiments, the surface roughness $Ra_2$ of the B-side surface is such that 0.3 nm≤$Ra_2$≤1000 nm. In other embodiments, the surface roughness $Ra_2$ of the B-side surface is such that 5 nm≤$Ra_2$≤500 nm. In still other embodiments, the surface roughness $Ra_2$ of the B-side surface is such that 20 nm≤$Ra_2$≤100 nm. In some embodiments, the surface roughness $Ra_2$ of the B-side surface 52 is such that a ratio $Ra_2$:$Ra_1$ is greater than or equal to about 1.5. In some embodiments, the ratio $Ra_2$:$Ra_1$ is such that 1.5≤$Ra_2$:$Ra_1$≤100. In some other embodiments, the ratio $Ra_2$:$Ra_1$ is such that 4≤$Ra_2$:$Ra_1$≤50. In still other embodiments, the ratio $Ra_2$:$Ra_1$ is such that 5≤$Ra_2$:$Ra_1$≤20.

In the embodiments described herein, the B-side surface 52 of the glass substrate 50 is preferably free from defects having a defect size greater than 100 µm. For visible defects, the B-side surface 52 of the glass substrate 50 is preferably free from defects having a defect size greater than 100 µm at an illuminance of 1500 Lux. In some other embodiments, the B-side surface 52 of the glass substrate 50 is free from defects having a defect size greater than 75 µm. In still other embodiments, the B-side surface 52 of the glass substrate 50 is free from defects having a defect size greater than 50 µm.

Referring now to FIGS. 1 and 2A-4B, the B-side surface 52 of the glass substrate 50 further comprises a plurality of texturing features 62. The texturing features 62 generally decrease the contact surface area C of the B-side surface 52 of the glass substrate to less than the gross surface area A (i.e., the length L×the width W) of the B-side surface and, as a result, mitigate the generation of charge when the B-side surface 52 comes in contact with a dissimilar material. Moreover, the reduced contact surface area of the B-side surface 52 also decreases the friction between the B-side surface 52 of the glass substrate 50 and a working surface (i.e., the surface of handling and/or conveying equipment) which may be brought into contact with the B-side surface of the glass substrate.

In the embodiments of the glass substrate 50 described herein, the texturing features 62 are formed in the B-side surface 52 of the glass substrate 50 such that the texturing features extend from the B-side surface into the thickness S of the glass substrate without extending through the thickness S of the glass substrate 50. In general, the texturing features 62 may have a peak-to-valley height H which is greater than about 0.05 µm. In some embodiments, the peak to valley height H is such that 0.05 µm≤H≤3.75 µm. In some other embodiments, the peak to valley height H of the texturing features 62 is such that 0.07 µm≤H≤2 µm. In still other embodiments, the peak to valley height H is such that 0.1 µm≤H≤1 µm.

Moreover, in some embodiments, the peak-to-valley height H may be related to the thickness S of the glass substrate 50. For example, in some embodiments, the peak-to-valley height H of the texturing features is such that H≤0.04*S. In still other embodiments, the peak-to-valley height H is such that H≤0.02*S. In yet other embodiments, the peak-to-valley height H of the texturing features 62 is such that H≤0.01*S.

The center-to-center pitch P of the texturing features 62 is generally at least 1.5 mm in at least one direction on the surface of the substrate (i.e., the x-direction or the y-direction of the coordinate axes depicted in FIG. 1). In some embodiments, the center-to-center pitch P may be less than about 25 mm. For example, in some embodiments, the center-to-center pitch P of the texturing features 62 is such that 1.5 mm≤P≤25 mm. In some other embodiments, the center-to-center pitch P is such that 1.5 mm≤P≤10 mm. In still other embodiments, the center-to-center pitch P of the texturing features 62 is such that 2.0 mm≤P≤8 mm.

While the center-to-center pitch P of the texturing features 62 has been described herein and being at least 1.5 mm, it should be understood that 1.5 mm is a minimum value and that, in some embodiments, the center-to-center pitch P between adjacent texturing features 62 may vary between pairs of texturing features, such as when the texturing features 62 are randomly distributed on the surface of the glass substrate. Alternatively, the center-to-center pitch P may be uniform between adjacent texturing features, such as when the texturing features 62 are formed in the B-side surface of the glass substrate in a regular pattern. Moreover, in some embodiments, the center-to-center pitch P may be at least 1.5 mm in both the x-direction and the y-direction.

Figure 2A:
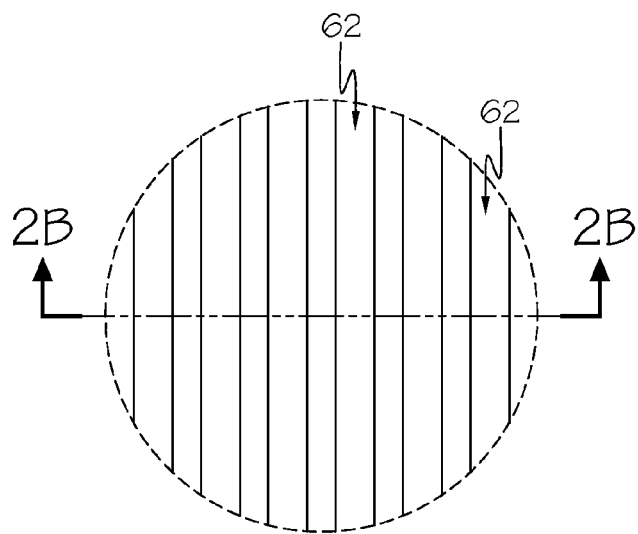
FIG. 2A is an enlarged view of a portion of the B-side surface of the glass substrate of FIG. 1 schematically depicting a plurality of texturing features formed in the B-side surface of the glass substrate, according to one embodiment shown and described herein.
Figure 2B:
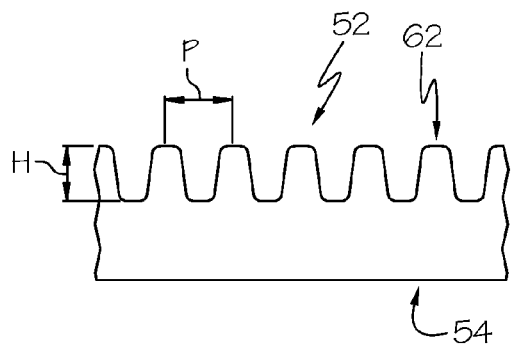
FIG. 2B is a cross section of the portion of the B-side surface of the glass substrate depicted in FIG. 2A, according to one or more embodiments shown and described herein.

Referring now to FIGS. 2A-4B, the texturing features formed in the B-side surface of the glass substrate may have various geometrical configurations. For example, FIGS. 2A and 2B depict one embodiment in which the texturing features 62 are grooves formed into the B-side surface 52 of the glass substrate 50. In this embodiment, the grooves or channels extend in the length direction L of the glass substrate 50. Accordingly, each of the grooves extends continuously in one direction and is repeated in the transverse direction. As such, the grooved texturing features 62 are considered a one-dimensional pattern. While the texturing features 62 depicted in FIGS. 2A and 2B generally have a rounded bottom, it should be understood that the grooves may be formed with various other geometries. For example, the grooves may be v-shaped in cross section or, alternatively, may have a substantially square or rectangular shape in cross section.

Figure 3A:
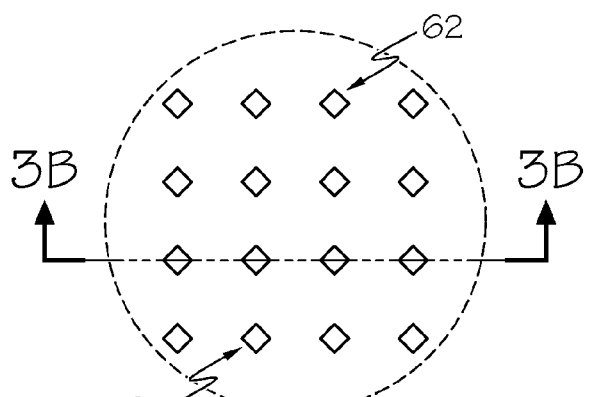
FIG. 3A is an enlarged view of a portion of the B-side surface of the glass substrate of FIG. 1 schematically depicting a plurality of texturing features formed in the B-side surface of the glass substrate, according to one embodiment shown and described herein.
Figure 3B:
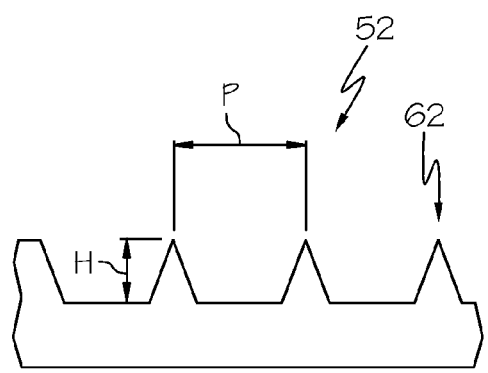
FIG. 3B is a cross section of the portion of the B-side surface of the glass substrate depicted in FIG. 3A, according to one or more embodiments shown and described herein.

Referring now to FIGS. 3A and 3B, another embodiment of texturing features 62 formed in the B-side surface 52 of a glass substrate are schematically depicted. In this embodiment, the texturing features 62 are pyramidal with a square base such that the texturing features are substantially v-shaped in cross section. In this embodiment, the texturing features are discrete features formed in a regular, two-dimensional pattern as opposed to the continuous, grooved texturing features 62 depicted in FIG. 2A.

Figure 4A:
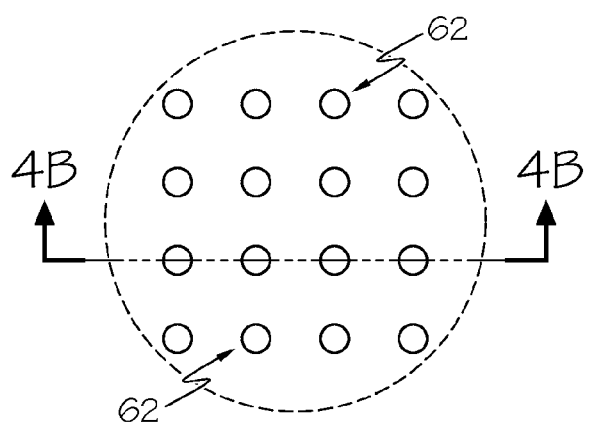
FIG. 4A is an enlarged view of a portion of the B-side surface of the glass substrate of FIG. 1 schematically depicting a plurality of texturing features formed in the B-side surface of the glass substrate, according to one embodiment shown and described herein.
Figure 4B:
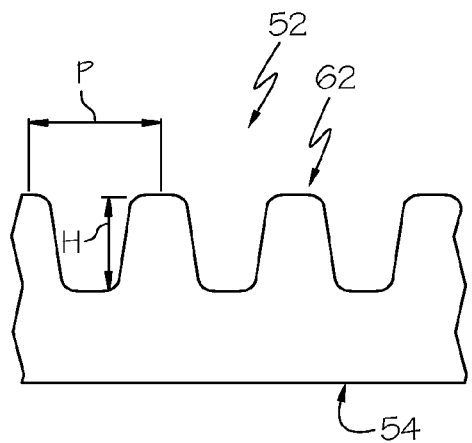
FIG. 4B is a cross section of the portion of the B-side surface of the glass substrate depicted in FIG. 4A, according to one or more embodiments shown and described herein.

Referring now to FIGS. 4A and 4B, in another embodiment, the texturing features 62 are formed in the B-side surface 52 as hemispherical dimples or divots. As with the texturing features 62 depicted in FIGS. 3A and 3B, the hemispherical texturing features 62 depicted in FIGS. 4A and 4B are discrete features arranged in a regular, two-dimensional pattern.

While FIGS. 2A-4B depict various embodiments of texturing features which may be formed in the B-side surface of a glass substrate, it should be understood that texturing features with other geometrical patterns may be utilized. For example, the texturing features may be, without limitation, conical, ribbed, diamond-shaped, cross-hatched, circles or semi-circles, zig-zags, spiral, squares, triangles, hexagons, rectangles, and/or various combinations thereof. Moreover, it should also be understood that the texturing features may be continuous features, as depicted in FIG. 2A, or discrete features, as depicted in FIGS. 3A and 4A. Further, it should also be understood that the texturing features may be randomly positioned in the B-side surface or positioned in a regular one-dimensional or two-dimensional pattern, as depicted in FIGS. 2A, 3A and 4A.

In the embodiments described herein, the texturing features 62 may be formed across the entire width of the glass substrate or, alternatively, the texturing features 62 may be formed only in the quality area 56 of the glass substrate. Moreover, the texturing features 62 may be formed over different lengths L of the glass substrate. For example, in some embodiments, the texturing features 62 may be formed over a length L of the glass substrate which is on the order of 1000's of millimeters, such as when the pattern of the texturing features is repeated over a length of the glass substrate reaching in excess of 1000 millimeters.

Figure 5:
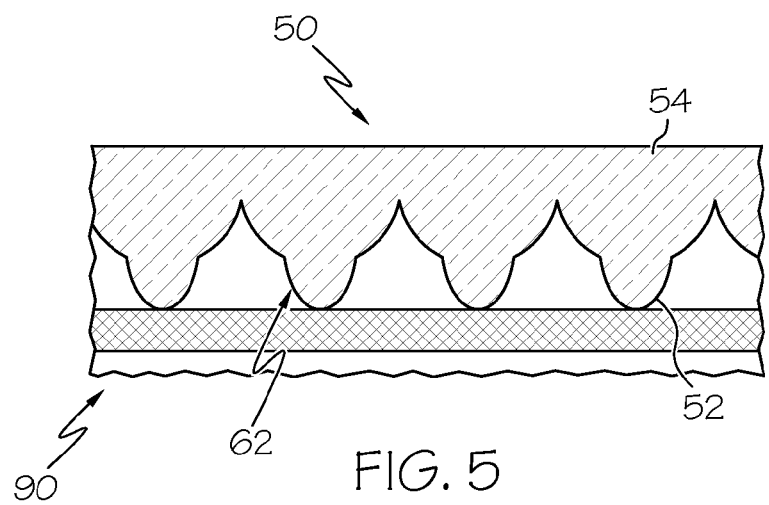
FIG. 5 schematically depicts the contact area between the B-side surface of the glass substrate of FIG. 1 and a working surface.

Referring now to FIG. 5, the texturing features 62 generally decrease the contact surface area C of the B-side surface 52 of the glass substrate 50 relative to the gross surface area A (i.e., the length L×the width W) of the B-side surface of the glass substrate. Accordingly, when the B-side surface 52 is brought into contact with a working surface 90, as shown in FIG. 5, the contact surface area C between the working surface 90 and the B-side surface 52 is less than the gross surface area A which, in turn, reduces the friction between the glass substrate 50 and the working surface 90. Moreover, the reduction in the contact surface area C also reduces the amount of charge generated when the working surface 90 and the glass substrate 50 are formed from dissimilar materials which, in turn, mitigates the risk of accumulated charge damaging the glass substrate 50 and/or debris collecting on the surface of the glass substrate 50.

In the embodiments described herein, the contact surface area C of the B-side surface 52 is significantly less than the gross surface area A of the B-side surface. For example, in some embodiments, the contact surface area C is such that C≤0.20*A. In some other embodiments, the contact surface area C of the B-side surface is such that C≤0.35*A. In still other embodiments, the contact surface area C is such that C≤0.5*A. In general, smaller surface contact areas generate less charge when the B-side surface 52 of the glass substrate is brought into contact with a dissimilar material and reduces the friction between the B-side surface and the material.

Methods of forming the glass substrates with texturing features formed in the B-side surface of the glass substrate will now be described in more detail with specific reference to FIGS. 6-13.

The glass substrates described herein may generally be formed by melting glass batch materials to form molten glass and thereafter forming the molten glass into a glass substrate. In the embodiments described herein, the glass substrates are formed utilizing downdraw processes in which the glass substrate is formed from molten glass without mechanically contacting at least the A-side surface of the glass substrate prior to the glass substrate solidifying to an elastic state where the viscosity of the glass is generally greater than about $10^{13}$ Poise in order to preserve the surface quality of the A-side surface of the glass substrate. Exemplary processes include the slot draw process and the fusion downdraw process.

Figure 6:
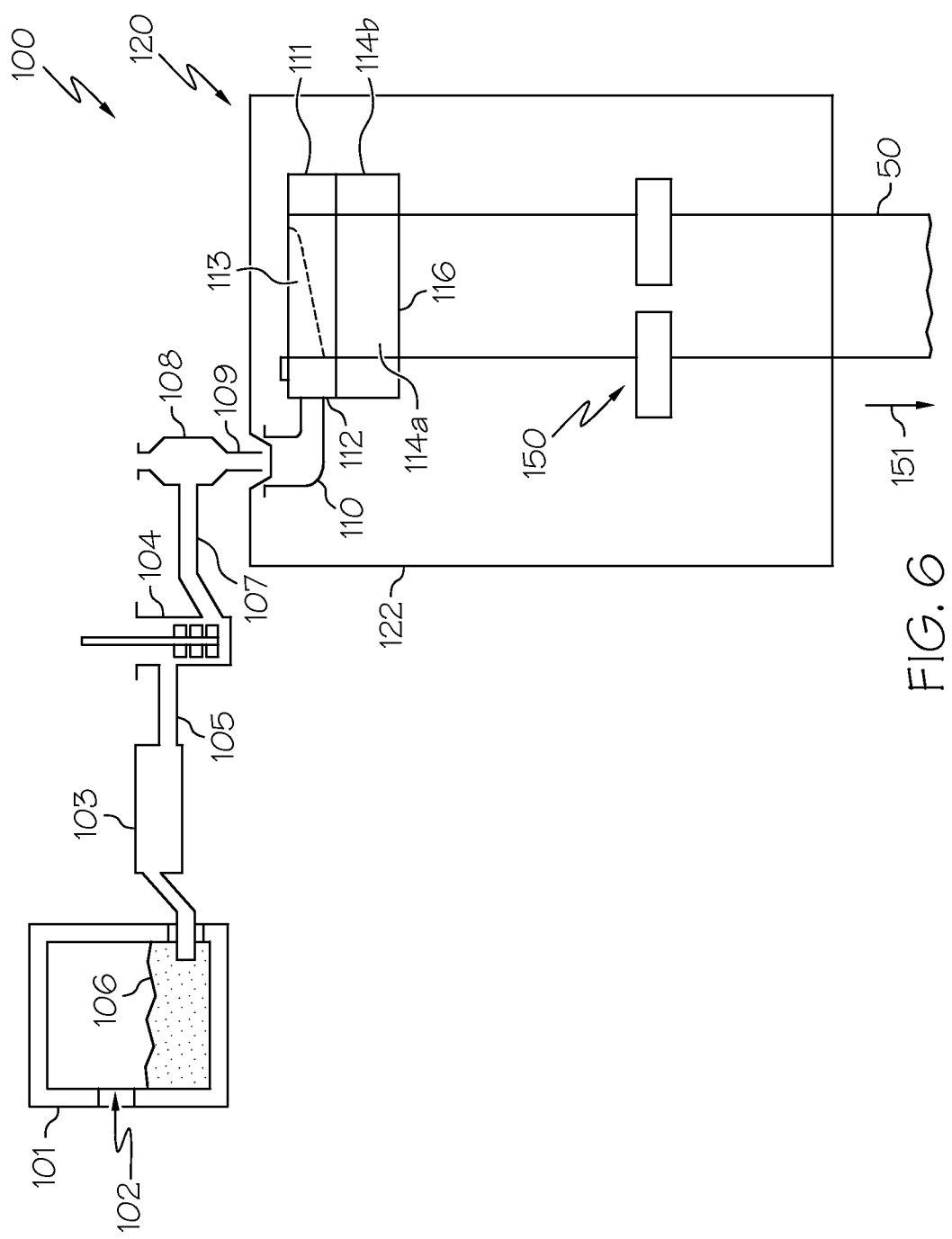
FIG. 6 schematically depicts a glass forming apparatus for forming a glass substrate, according to one or more embodiments shown and described herein.

Referring to FIG. 6 by way of example, an exemplary glass manufacturing apparatus 100 for forming glass substrates from molten glass is schematically depicted in which a fusion draw machine is used to form the molten glass into glass substrates. The glass manufacturing apparatus 100 includes a melting vessel 101, a fining vessel 103, a mixing vessel 104, a delivery vessel 108, and a fusion draw machine (FDM) 120. Glass batch materials are introduced into the melting vessel 101 as indicated by arrow 102. The batch materials are melted to form molten glass 106. The fining vessel 103 has a high temperature processing area that receives the molten glass 106 from the melting vessel 101 and in which bubbles are removed from the molten glass 106. The fining vessel 103 is fluidly coupled to the mixing vessel 104 by a connecting tube 105. That is, molten glass flowing from the fining vessel 103 to the mixing vessel 104 flows through the connecting tube 105. The mixing vessel 104 is, in turn, fluidly coupled to the delivery vessel 108 by a connecting tube 107 such that molten glass flowing from the mixing vessel 104 to the delivery vessel 108 flows through the connecting tube 107.

The delivery vessel 108 supplies the molten glass 106 through a downcomer 109 into the FDM 120. The FDM 120 comprises an enclosure 122 in which an inlet 110, an isopipe 111 and at least one draw assembly 150 are positioned. As shown in FIG. 6, the molten glass 106 from the downcomer 109 flows into an inlet 110 which leads to the isopipe 111. The isopipe 111 includes an opening 112 that receives the molten glass 106 which flows into a trough 113 and then overflows and runs down two converging sides 114a and 114b of the isopipe 111 before fusing together at a root 116 of the isopipe 111, where the two sides join. The resulting glass substrate is then drawn in a downward direction 151 by the draw assembly 150 as a continuous glass substrate 50.

Figure 7:
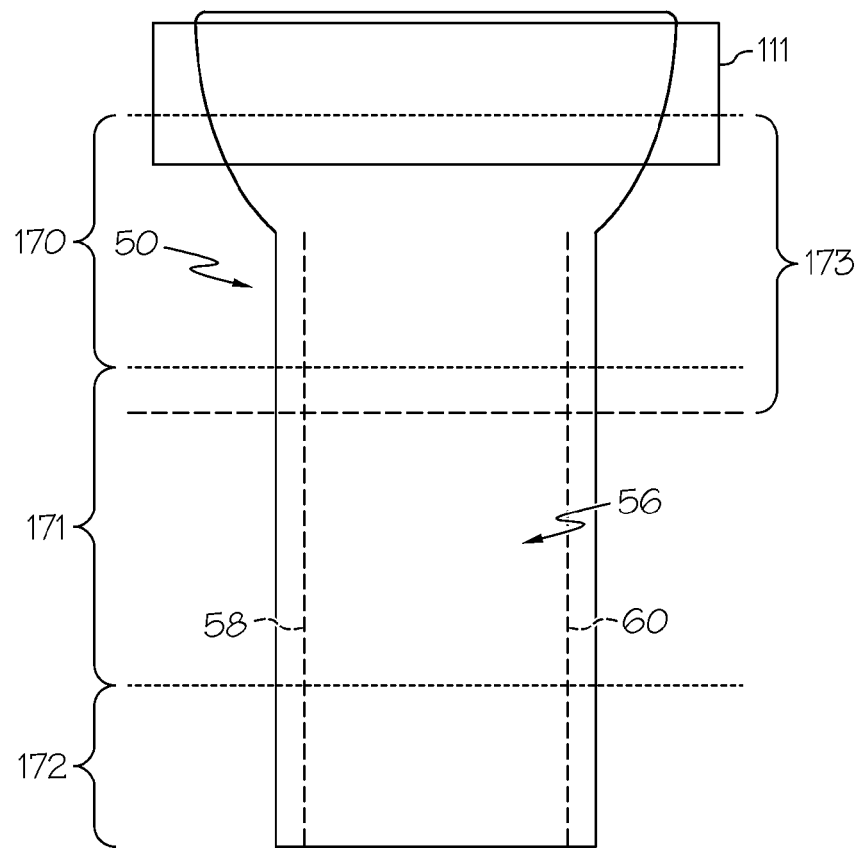
FIG. 7 schematically depicts a plurality of temperature zones of a glass substrate as the glass substrate is formed from molten glass and solidifies, according to one or more embodiments shown and described herein.

Referring now to FIG. 7, as molten glass flows over the isopipe 111 and is formed in the continuous glass substrate 50, the molten glass cools and solidifies over three zones: a viscous zone 170 where the glass is at elevated temperatures and has a decreased viscosity; a visco-elastic zone 171 where the glass has a decreased temperature and an increased viscosity as the glass begins to solidify; and an elastic zone 172 where the glass is fully solidified. For example, in some embodiments, the temperature of the glass in the viscous zone 170 may be greater than about 800° C. and the viscosity is generally less than about $10^{13}$ Poise. In these embodiments, the temperature of the visco-elastic zone is in a range from about 680° C. to less than about 800° C. and the viscosity of the glass is approximately $10^{13}$ Poise. Further, in these embodiments, the temperature of the elastic zone is less than about 680° C. and the viscosity of the glass is greater than $10^{13}$ Poise. In the embodiments described herein, the texturing features are formed in the glass substrate in an imprinting zone 173 which overlaps the viscous zone 170 and the visco-elastic zone 171. In one embodiment, the glass substrate 50 has a temperature T1 in the imprinting zone such that 680° C. <T1 <1200° C. In another embodiment, the glass substrate 50 has a temperature T1 in the imprinting zone such that 800° C. <T1 <1000° C. In general, the temperature T1 of the glass substrate 50 in the imprinting zone 173 is such that the viscosity of the glass is from about $10^{13}$ Poise to about 150,000 Poise, more preferably from about $10^{13}$ Poise to about 40,000,000 Poise, such that the glass of the glass substrate is sufficiently malleable and to enable forming the texturing features in the B-side surface of the glass substrate.

In the embodiments described herein, the resultant size of the texturing features may be controlled based upon the temperature of the glass substrate when the texturing features are formed in the B-side surface of the glass substrate. For example, in some embodiments, the texturing features may be formed in the B-side surface of the glass substrate when the glass substrate is at an elevated temperature and the glass has a low viscosity. Under these conditions, the texturing features have a first size D1 at the temperature T1. As the glass substrate is drawn and cooled following formation of the texturing features, the glass reflows and, as such, the resultant texturing features have a second size D2 when the glass substrate is at room temperature, wherein D1>D2. The term "size," as used herein, may refer to any dimension of the texturing feature including the cross sectional area of the feature and/or the peak-to-valley height H of the feature. The relative reduction in the size of the feature may be characterized by a reflow factor R which relates the first size D1 to the second size D2. For example, if a texturing feature has a first size D1 of 100 μm and a second size D2 of 1 μm, the reflow factor R is 100×. In some embodiments described herein, the reflow factor R is generally from about 0 to about 1000×. For example, in some embodiments, the reflow factor R is from about 0 to about 500×. In some other embodiments, the reflow factor R is from about 0 to about 100×. When the texturing features are formed in the glass substrate when the glass substrate has high viscosity, very little reflow may occur and the reflow factor R is essentially zero.

Figure 8:
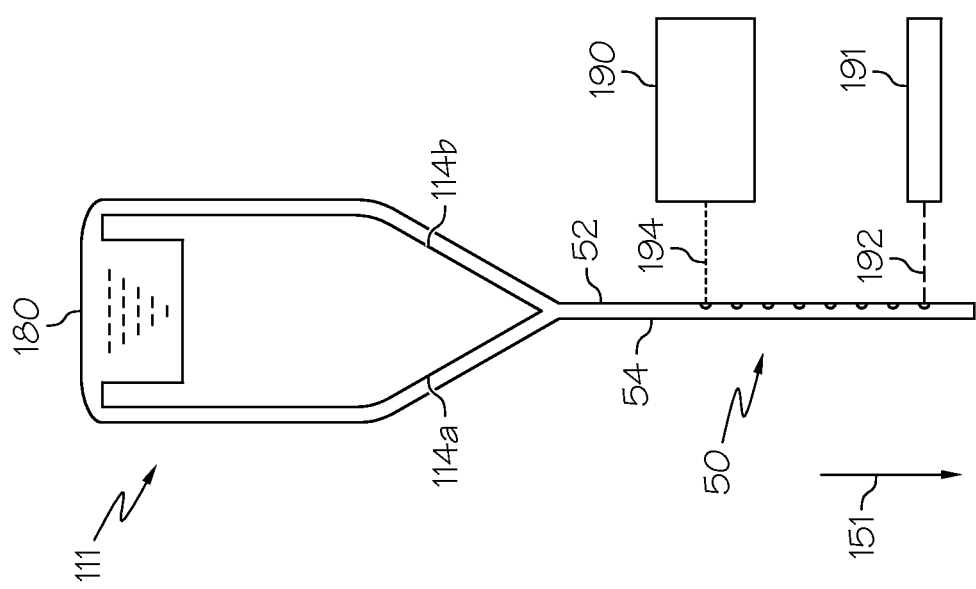
FIG. 8 schematically depicts the formation of texturing features in the B-side surface of a glass substrate with a laser source, according to one or more embodiments shown and described herein.

Referring now to FIG. 8, in one embodiment, the texturing features are formed in the B-side surface 52 of the glass substrate 50 utilizing at least one laser source 190. Specifically, molten glass 180 is supplied to the isopipe 111 such that the molten glass 180 flows over the converging sides 114a, 114b of the isopipe and rejoins at the root of the isopipe 111 thereby forming a glass substrate with the desired A-side surface characteristics (i.e., the A-side surface is formed without mechanical contact such that the A-side surface has the desired "pristine" surface without defects), as described hereinabove.

As the glass substrate 50 is drawn in the downward direction 151, a beam 194 of at least one laser source 190 is directed onto the B-side surface 52 of the glass substrate 50 as the glass substrate 50 passes through the imprinting zone. In one embodiment, the beam 194 is focused on the B-side surface 52 of the glass substrate 50. In another embodiment, the beam 194 of the laser source 190 is focused below the B-side surface 52 of the glass substrate, in the thickness of the glass substrate 50. The laser source 190 is generally operated at a wavelength and power which prevents significant ablation of glass from the glass substrate 50 and prevents the beam 194 of the laser source 190 from penetrating through the glass substrate 50. However, in some embodiments, slight ablation of the surface of the glass substrate may occur in the viscous zone without the associated formation of particulate debris from the surface of the glass substrate. In these embodiments, reflow of the glass substrate following impingement of the laser results in the formation of the final textured feature. In one embodiment, the laser source 190 is a $CO_2$ laser with a wavelength in the range from about 9.2 μm to about 11.4 μm. The laser source 190 is operated such that the beam 194 has a power in the range from about 0.5 mW to 10 W continuous wave power or 0.5 mJ to 10 J pulse energy. The laser source 190 may be operated to produce a pulsed output beam which is utilized to create the texturing features in the B-side surface of the glass substrate. The duration of the pulse, the power of the beam 194 and the spot size of the beam 194 are controlled such that the laser source 190 does not appreciably raise the temperature of the glass substrate or induce a large-scale thermal stress gradient within the glass substrate. However, it should be understood that the beam 194 of the laser does induce a localized surface thermal stress gradient which initiates texture formation at the surface of the substrate. While the operational characteristics of a $CO_2$ laser source are described herein, it should be understood that other laser sources may be utilized to form the texturing features in the glass substrate. The selection of the laser type may be dependent on the glass composition/chemistry which affects the absorbance, transmittance and reflectance of the laser radiation.

Still referring to FIG. 8, as the glass substrate 50 is drawn in the downward direction 151 through the imprinting zone, the beam 194 of the laser source 190 forms the texturing features in the glass substrate. In one embodiment, a single laser source 190 is utilized to form the texturing features by scanning the beam 194 over the B-side surface 52 of the glass substrate to create the desired pattern. Alternatively, a plurality of laser sources may be utilized to create the desired pattern. For example, when a plurality of continuous, grooved texturing features are desired, a plurality of laser sources may be utilized to form the continuous grooves as the glass substrate 50 is drawn in the downward direction.

In one embodiment, an inert cover gas (not shown) may be directed over the surface of the glass substrate 50 as the beam 194 of the laser source 190 is directed onto the B-side surface 52 to prevent any reactions from occurring at the surface of the glass substrate.

In one embodiment, after the texturing features are formed, one or more streams of compressed gas 192, such as air, argon nitrogen, helium or the like, may be directed onto the B-side surface 52 of the glass substrate 50 from a gas jet 191 to facilitate smoothing of the B-side surface 52. The smoothing operation reduces the size of the texturing features in a similar manner as the reflow of the glass described above. Accordingly, it should be understood that the controlled application of one or more streams of compressed gas 192 may be used in conjunction with the beam 194 of the laser source 190 to form texturing features in the B-side surface 52 of the glass substrate having the desired dimensions.

Figure 9:
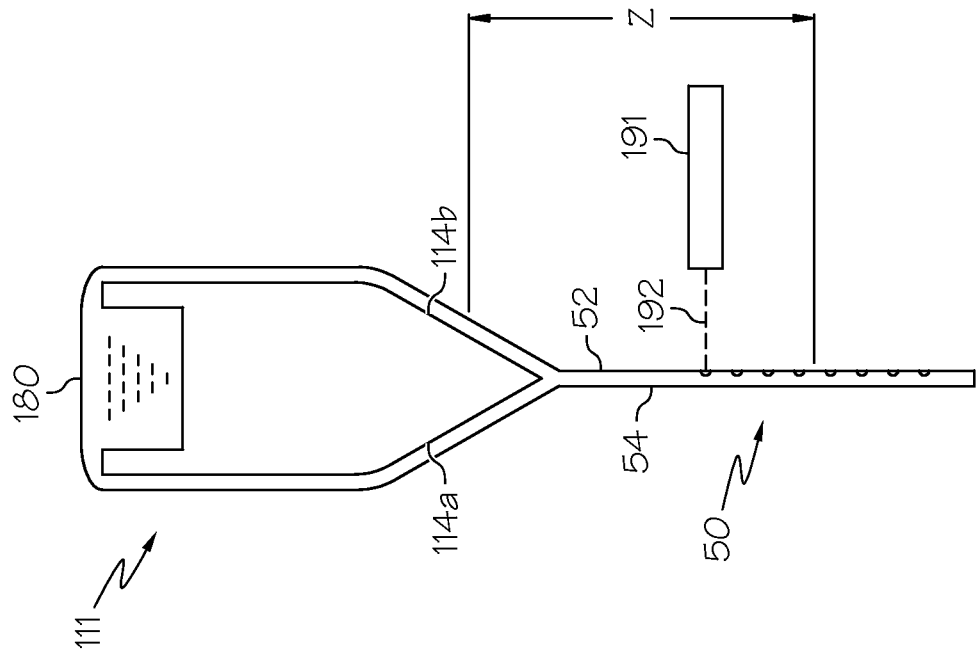
FIG. 9 schematically depicts the formation of texturing features in the B-side surface of a glass substrate with a compressed gas jet, according to one or more embodiments shown and described herein.

Referring now to FIG. 9, in another embodiment, the texturing features are formed in the B-side surface 52 of the glass substrate 50 utilizing at least one compressed gas jet 191. Specifically, molten glass 180 is supplied to the isopipe 111 such that the molten glass 180 flows over the converging sides 114a, 114b of the isopipe 111 and rejoins at the root of the isopipe 111 thereby forming a glass substrate 50 with the desired A-side surface characteristics (i.e., the A-side surface is formed without mechanical contact such that the A-side surface has the desired "pristine" surface without defects), as described above.

As the glass substrate 50 is drawn in the downward direction 151, a stream of compressed gas 192, such as nitrogen, air, argon, helium or the like, is directed onto the B-side surface 52 of the glass substrate 50 from at least one compressed gas jet 191 while the glass substrate is in the imprinting zone. The stream of compressed gas 192 is impinged on the B-side surface 52 of the glass substrate 50 thereby forming the desired texturing features in the B-side surface 52. The stream of compressed gas 192 may be directed onto the B-side surface while the glass is positioned within the zone Z depicted in FIG. 9. Accordingly, it should be understood that the stream of compressed gas 192 may be directed onto the B-side surface as the molten glass 180 flows over the converging side 114b of the isopipe or after the molten glass has converged at the root of the isopipe.

The stream of compressed gas 192 causes localized surface stress gradients that form textured patterns only at the B-side surface. The stream of compressed gas 192 may also slightly displace low viscosity glass at the surface to form the texturing features. In addition, the stream of compressed gas may be pulsed to form ripples at the surface of the glass substrate which later form a textured pattern as the glass reflows. In general, the size of the jet (i.e., the cross sectional area of the orifice from which the stream of compressed gas is emitted) is on the order of a quarter (0.25×) to double (2×) the pitch P of the texturing features. In some embodiments, a single compressed gas source is coupled to a large plate or bar in which orifices are formed.

The plate or bar spans the width of the glass substrate. The stream of compressed gas 192 may be directed into the plate or bar and onto the glass through the orifices. In some embodiments, the orifices may be oriented at various angles. For example, in some embodiments, the stream of compressed gas may be perpendicular to the surface of the glass. Alternatively, the angle between the stream of compressed gas and the surface of the glass may be in a range from about 90 degrees to +/−45 degrees. In one embodiment, the orifices are arranged in a circular pattern with the angular orientation of each jet in the pattern varying. In some embodiments, the pressure of the compressed gas stream is less than about 5 psi. However, greater of lesser pressures may also be used to form the texturing features.

In one embodiment, a single compressed gas jet 191 is used to form a plurality of discrete texturing features in the B-side surface 52 by pulsing the stream of compressed gas 192 as the compressed gas jet 191 is scanned over the B-side surface 52. In another embodiment, a plurality of compressed gas jets 191 are utilized to form a pattern of discrete texturing features by individually operating each compressed gas jet 191 in a pulsed manner. In yet another embodiment, a plurality of compressed gas jets 191 may be operated in a continuous manner (i.e., the stream of compressed gas 192 is not pulsed) to form a plurality of continuous texturing features in the B-side surface 52 of the glass substrate 50. The depth and cross sectional shape of the texturing features may be controlled by adjusting the pressure and cross sectional shape of the stream of compressed gas 192.

Referring now to FIGS. 10A and 10B, in some other embodiments, the texturing features may be formed by selectively drawing heat from the surface of the glass substrate which, in turn, creates localized hot/cold spots in the B-side surface 52 of the glass substrate 50 and the associated thermal gradients result in the formation of texturing features in the B-side surface. For example, referring to FIG. 10A, a series of hair-pin tubes 220 (one shown in FIG. 10A) may be positioned proximate the B-side surface 52 of the glass substrate and spaced apart across the width of the glass substrate. The spacing between adjacent hair-pin tubes 220 may be 5 mm to 50 mm. The ends of the hair-pin tubes are spaced apart from the B-side surface 52 by a distance J which, in some embodiments described herein, is from about 7 cm to about 25 cm. The diameter of the tubes may be from about 5 to 10 mm. As the glass substrate 50 is drawn from the converging sides 114a, 114b of the isopipe 111, cooling fluid 230, such as a compressed gas or liquid, is directed through the hair-pin tubes 220 thereby drawing heat away from localized areas of the glass substrate 50 adjacent to the ends of the hair-pin tubes 220. The resultant thermal gradients produce patterning features in the glass substrate as the glass substrate cools at different rates.

Referring to FIG. 10B, in another embodiment, cap tubes 221 with an inner cooling tube 223 for cooling fluid inflow are utilized to bring the flow of cooling fluid 230 proximate the B-side surface 52 of the glass substrate 50. The cooling fluid 230 flows into the cap tube 221 and is redirected at the end of the tube closest to the B-side surface 52, carrying away heat from a localized area of the B-side surface. The spacing between adjacent cap tubes 221 may be 5 mm to 50 mm and the ends of the cap tubes 221 are spaced apart from the B-side surface 52 by a distance J which, in some embodiments described herein, is from about 7 cm to about 25 cm as described above. The diameter of the cap tubes 221 may be from about 5 to 10 mm.

As described hereinabove, after the texturing features are formed, one or more streams of compressed gas may be directed onto the B-side surface 52 of the glass substrate 50 from a gas jet (not shown) to facilitate smoothing of the B-side surface 52. The smoothing operation reduces the size of the texturing features in a similar manner as the reflow of the glass described above. The stream of compressed gas utilized for air-jet smoothing of the B-side surface 52 generally has a lower pressure than the pressure of the stream of compressed gas utilized for actual formation of the texturing features.

Figure 11:
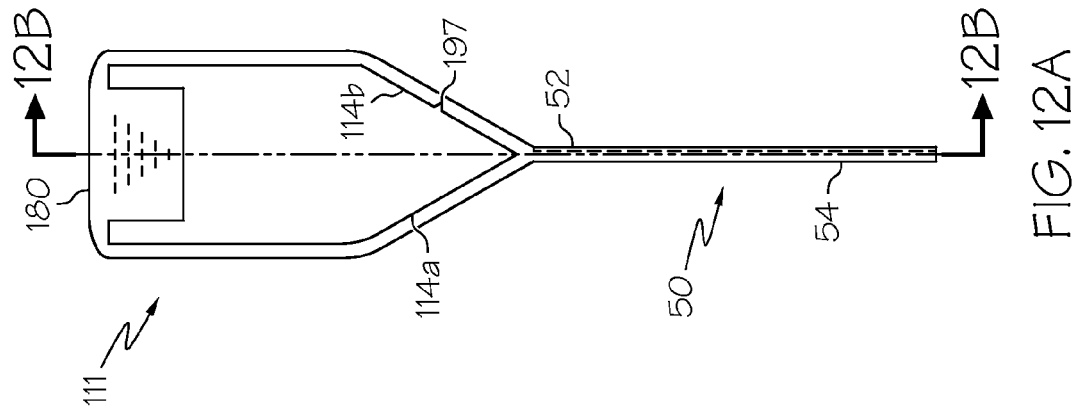
FIG. 11 schematically depicts the formation of texturing features in the B-side surface of a glass substrate utilizing a landing attached to a root of the isopipe.

Referring now to FIG. 11, in another embodiment, the texturing features are formed utilizing a landing 196 attached to the root of the isopipe 111 such that the landing 196 is positioned in the imprinting zone. In this embodiment, a barrier 198 is utilized at the top of the isopipe 111 such that molten glass 180 only flows over one converging side 114a of the isopipe 111. The molten glass flows over the isopipe 111 thereby forming a glass substrate 50 having an A-side surface 54 which is formed without mechanical contact. The glass substrate 50 is then directed over the landing 196 such that the B-side surface 52 contacts the landing 196. The contact between the landing 196 and the B-side surface 52 forms a plurality of continuous texturing features (such as grooves) in the B-side surface 52. In one embodiment, at least a portion of a contact surface of the landing 196 comprises a plurality of patterning features 197 which generally correspond to the texturing features imprinted into the B-side surface 52 of the glass substrate.

In some embodiments, the landing 196 includes one or more active heating elements (not shown) which are utilized to maintain the temperature and viscosity of the glass substrate 50 as the glass substrate is directed over the landing 196 thereby enabling the formation of the texturing features.

As noted hereinabove, a smoothing operation may be performed on the B-side surface 52 of the glass substrate 50 after the texturing features are formed in order to achieve texturing features having the desired size in the solidified glass substrate 50.

Figure 12A:
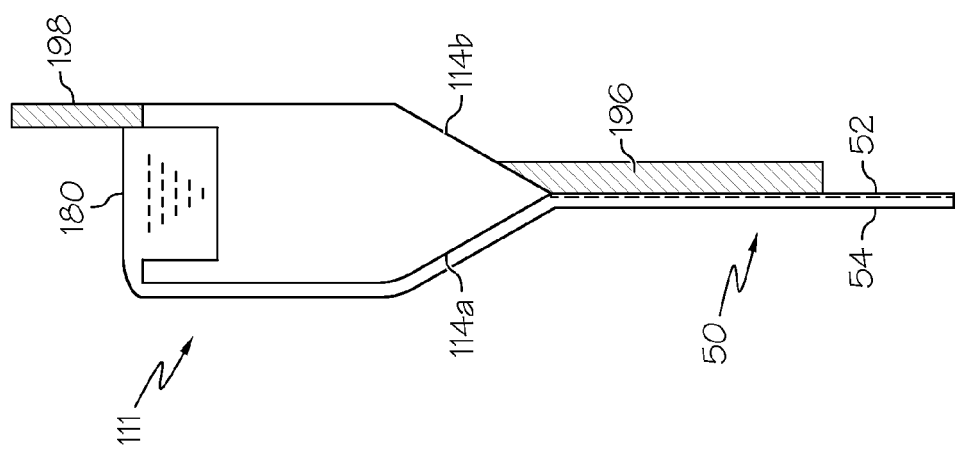
FIG. 12A schematically depicts the formation of texturing features in the B-side surface of a glass substrate utilizing an isopipe with patterning features.
Figure 12B:
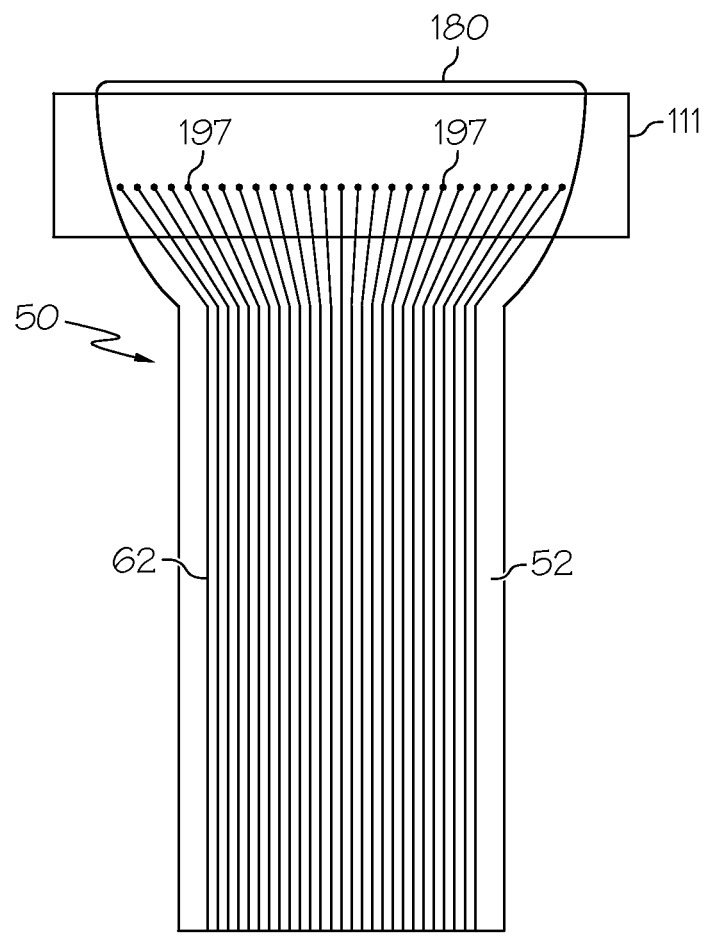
FIG. 12B schematically depicts a cross section of the isopipe with patterning features of FIG. 12A showing the patterning features and the resultant texturing features in the glass substrate.

Referring now to FIGS. 12A and 12B, in another embodiment, the texturing features 62 are formed in the B-side surface 52 of the glass substrate 50 utilizing an isopipe 111 with patterning features 197 on the converging side 114b. Specifically, one converging side 114b of the isopipe 111 is formed with a plurality of patterning features 197 on the surface of the converging side 114b. As shown in FIG. 12B, the plurality of patterning features 197 are spaced across the width of the isopipe. The patterning features can either be projections from or indentations into the isopipe surface (projections shown in FIGS. 12A and 12B). Molten glass 180 flows over the converging sides 114a, 114b of the isopipe 111 and rejoins at the root of the isopipe 111. The molten glass 180 flowing over the converging side 114a forms the A-side surface 54 of the glass substrate. However, the patterning features 197 on the converging side 114b disrupt the flow of the molten glass and cause perturbations in the molten glass flowing over the converging side 114b which, in turn, results in the formation of a plurality of continuous texturing features 62 (i.e., grooves) in the B-side surface 52 of the glass substrate 50. The patterning features 197 may generally have a size in a range from 0.5× the pitch P of the desired texturing features to 4× the pitch P of the desired texturing features.

In one embodiment, the flow of molten glass 180 over the converging sides 114a, 114b is asymmetric with a greater amount of glass flowing over the converging side 114a than the converging side 114b which contains the patterning features 197. The resultant thickened flow of glass which forms the A-side surface 54 of the glass substrate 50 dampens the perturbations from the glass flowing over the patterning features 197 and, as a result, prevents the perturbations from extending through to the A-side surface 54 of the glass substrate 50.

As noted hereinabove, a smoothing operation may be performed on the B-side surface 52 of the glass substrate 50 after the texturing features are formed in order to achieve texturing features having the desired size in the solidified glass substrate 50.

Referring now to FIGS. 13A and 13B, in another embodiment, the texturing features are formed in the B-side surface 52 of the glass substrate 50 with a texturing roller 200 which includes a plurality of patterning features 197 projecting from a contact surface of the texturing roller 200. In the embodiment shown in FIG. 13B, the patterning features 197 comprise a series of discrete protrusions extending from the contact surface of the texturing roller 200. However, it should be understood that the patterning features 197 may alternatively be formed as continuous ridges extending from the contact surface of the texturing roller 200 in the circumferential direction. The dimensions of the patterning features generally correspond to the initial size of the texturing features formed in the B-side surface 52 of the glass substrate 50.

In the embodiments described herein, the texturing roller 200 may include internal heating and cooling elements such that the temperature of the texturing roller 200 can be actively controlled. In general, the temperature of the texturing roller 200 is maintained at a temperature T2 which is slightly lower than the temperature T1 of the glass as it contacts the texturing roller 200. This reduces the propensity of the glass to adhere to the texturing roller 200 which degrades the quality of the glass.

In the embodiment shown in FIGS. 13A and 13B, the texturing roller 200 is stationary and positioned in the imprinting zone such that, as the glass substrate 50 is drawn through the imprinting zone, the texturing roller 200 is generally tangential to the B-side surface 52 of the glass substrate 50 and the patterning features 197 extend into the B-side surface 52 of the glass substrate thereby forming continuous texturing features in the surface of the glass substrate 50.

Figure 13C:
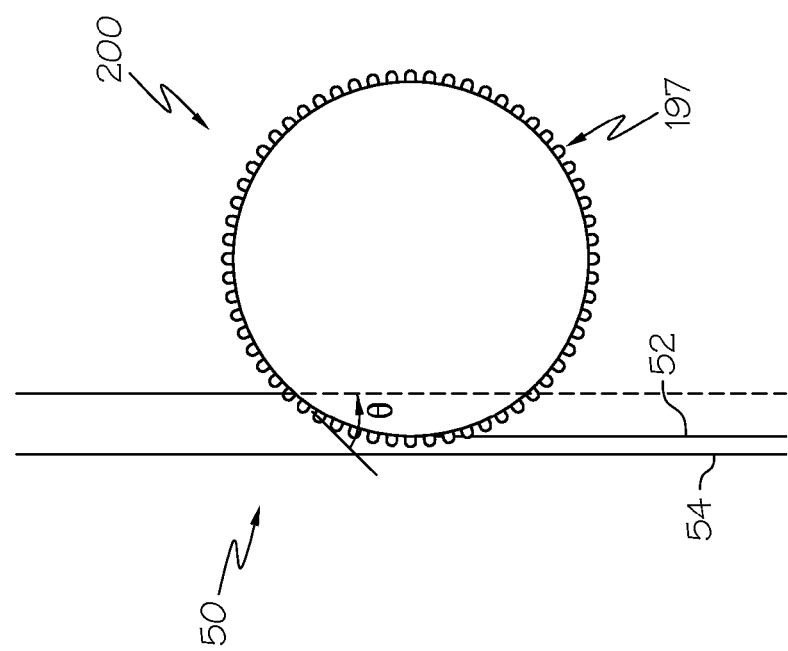

Referring now to FIG. 13C, in an alternative embodiment, the texturing roller 200 is stationary and positioned at the upper end of the imprinting zone where the glass substrate has a lower viscosity. In this embodiment, the texturing roller 200 is positioned such that a contact angle θ between the texturing roller 200 and the glass substrate 50 is from about 0 degrees up to and including 90 degrees. As the glass substrate 50 is directed over the texturing roller 200, the texturing roller patterns the glass substrate 50 thereby forming continuous texturing features in the B-side surface 52 of the glass substrate 50.

Figure 14:
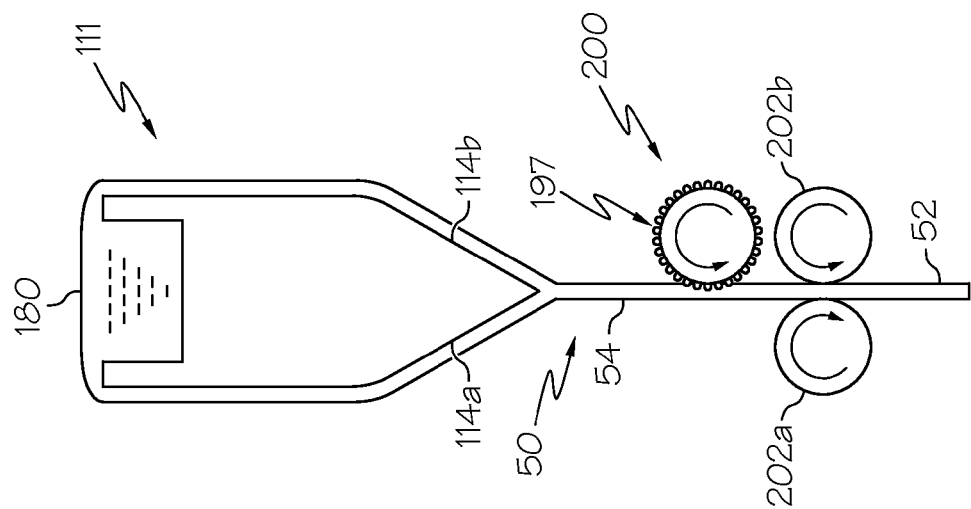
FIG. 14 schematically depicts the formation of texturing features in the B-side surface of a glass substrate with a rotating texturing roller having patterning features.

Referring now to FIG. 14, in another embodiment, a rotating texturing roller 200 is utilized in conjunction with pulling rollers 202a, 202b to imprint the texturing features on the B-side surface 52 of the glass substrate 50. The texturing roller 200 may be constructed as described hereinabove with respect to FIGS. 13A and 13B. However, in this embodiment, the texturing roller 200 is positioned in the imprinting zone above a pair of opposed pulling rollers 202a, 202b which are actively rotated to impart a drawing force on a glass substrate directed between the texturing roller 200 and the pulling rollers 202a, 202b. In these embodiments, the pulling rollers 202a, 202b contact the surfaces of the glass substrate 50 proximate the edges of the glass substrate and do not contact the A-side surface of the glass substrates in the quality area of the glass substrate between the edges so as to maintain the "pristine" quality of the A-side surface.

In this embodiment, molten glass 180 flows over the converging sides 114a, 114b of the isopipe and rejoins at the root of the isopipe 111 thereby forming a glass substrate 50 with an A-side surface 54 and a B-side surface 52. Thereafter, the glass substrate 50 is drawn in a downward draw direction where the B-side surface 52 of the glass substrate 50 contacts the texturing roller 200 as the glass substrate 50 is drawn with the pulling rollers 202a, 202b. Specifically, the texturing roller 200 is oriented such that the B-side surface 52 of the glass substrate contacts the texturing roller 200. As the pulling rollers 202a, 202b impart a drawing force on the glass substrate 50 in the downward draw direction, the patterning features 197 of the texturing roller 200 imprint texturing features into the B-side surface 52 of the glass substrate 50.

Because the texturing roller 200 is actively rotated in this embodiment such that the rotational speed of the texturing roller 200 matches or nearly matches the downdraw speed of the glass, the texturing features imprinted in the B-side surface 52 of the glass substrate 50 may be either continuous or discrete, depending on the structure of the patterning features 197 of the texturing roller 200. For example, where the patterning features 197 of the texturing roller 200 are discrete, the corresponding texturing features formed in the B-side surface 52 will also be discrete. However, where the patterning features 197 of the texturing roller 200 are continuous, the corresponding texturing features will also be continuous.

In some embodiments described herein the glass substrate is optionally subjected to an etching process following formation of the texturing features. The etching process may remove mobile ions from the glass substrate thereby altering the surface resistivity of the glass substrate. Moreover, the etching process may also be used to preferentially dissolve glass from the glass substrate, such as when a minor amount of debris or surface irregularities are generated during laser formation of the texturing features. Alternatively, the etching process may be utilized to uniformly dissolve glass at the surface of the glass substrate to enhance the shape of the texturing features.

Where the etching process is utilized to remove mobile ions from the glass substrate, the etching medium may comprise a mineral or organic acid. Suitable acids include HF, $HNO_3$, HCl, $H_2SO_4$, HBr, $HClO_4$, $H_3PO_4$, $HSbF_6$, $HBF_4$, $HPF_6$, $H_3BO_3$ or various combinations thereof.

In embodiments where the etching process is utilized to uniformly or preferentially dissolve glass from the glass substrate, the etching medium may include KOH, NaOH, $NH_4OH$, $Ba(OH)_2$, $Ca(OH)_2$ or various combinations thereof.

It should now be understood that the texturing features imprinted into the B-side surfaces of the glass substrates described herein substantially reduce the contact surface area of the B-side surface and, as a result, mitigate the generation of charge resulting from contact with a dissimilar material. Accordingly, when the glass substrates are utilized in a TFT-LCD display substrate, or a similar display substrate (such as a color filter substrate), the risk of damage to the TFT devices formed on the glass substrate due to electrostatic charge is significantly reduced. Moreover, the mitigation of the generation of charge also reduces the propensity of the glass substrate to attract dust and/or other particulate debris which may damage or degrade the surface of the glass substrate.

Further, the glass substrates described herein have A-side surfaces with low surface roughness as the A-side surfaces are formed without mechanical contact. These low surface roughness values on the A-side surfaces in conjunction with the texturing features imprinted on the B-side surfaces provide glass substrates with reduced risk of damage or surface degradation during the LCD or other display panel manufacturing process, thereby improving product yields and lowering manufacturing costs.

In addition, the reduction of the contact surface area of the glass substrate due to the incorporation of the texturing features in the B-side surface significantly lowers the friction between the glass substrates and handling and conveying equipment thereby reducing wear, equipment downtime, and generally lowering manufacturing costs.

It will be apparent to those skilled in the art that various modifications and variations can be made to the embodiments described herein without departing from the spirit and scope of the claimed subject matter. Thus it is intended that the specification cover the modifications and variations of the various embodiments described herein provided such modification and variations come within the scope of the appended claims and their equivalents.

What is claimed is:

1. A glass substrate comprising:
a planar A-side surface having a surface roughness $Ra_1$ of less than 0.5 nm;
a planar B-side surface opposed to the A-side surface, the B-side surface comprising:
a surface roughness $Ra_2$ such that a ratio $Ra_2:Ra_1$ is greater than or equal to about 1.5;
a plurality of texturing features formed in the B-side surface such that the texturing features extend from the B-side surface into a thickness S of the glass substrate without extending through the thickness S of the glass substrate, the plurality of texturing features having a peak-to-valley height H such that 0.05 μm≤H≤3.75 μm; and
a center-to-center pitch P between adjacent texturing features is at least 1.5 mm in at least one direction.

2. The glass substrate of claim 1, wherein H≤0.04*S.

3. The glass substrate of claim 1, wherein the center-to-center pitch P between adjacent texturing features is less than or equal to 25 mm.

4. The glass substrate of claim 1, wherein the B-side surface of the glass substrate has a planar area A and a contact surface area C, wherein C≤0.5*A.

5. A method for forming a glass substrate, the method comprising:
melting glass batch materials to form molten glass;
forming the molten glass into a glass substrate having a planar A-side surface and a planar B-side surface opposed to the A-side surface, wherein the glass substrate is formed without mechanically contacting at least the A-side surface prior to the glass substrate solidifying to a viscosity greater than $10^{13}$ Poise, wherein the planar A-side surface has a surface roughness $Ra_1$ of less than 0.5 nm after solidification;
drawing the glass substrate in a downward direction;
forming a plurality of texturing features into the B-side surface of the glass substrate while the glass substrate is at a temperature T1, wherein:
600° C.≤T1≤1200° C.;

the texturing features extend from the B-side surface into a thickness of the glass substrate without extending through the thickness of the glass substrate;

the plurality of texturing features have a peak-to-valley height H such that 0.05 µm≤H≤3.75 µm;

a center-to-center pitch P between adjacent texturing features is at least 1.5 mm in at least one direction; and the B-side surface has a surface roughness $Ra_2$ such that a ratio $Ra_2:Ra_1$ is greater than or equal to about 1.5.

6. The method of claim 5, wherein the plurality of texturing features have a first size D1 while the glass substrate is at the temperature T1 and a second size D2 when the glass substrate is cooled to room temperature, wherein D1>D2.

7. The method of claim 5, wherein the texturing features are formed by selectively drawing heat from the surface of the glass substrate as the glass substrate is drawn in the downward direction.

8. The method of claim 5, wherein the plurality of texturing features are formed in the B-side surface of the glass substrate by directing at least one stream of compressed gas onto the B-side surface of the glass substrate as the glass substrate is drawn in the downward direction.

9. The method of claim 5, wherein the plurality of texturing features are formed in the B-side surface of the glass substrate by contacting the B-side surface of the glass substrate with a texturing roller, wherein at least a portion of a contact surface of the texturing roller comprises a plurality of patterning features corresponding to the texturing features imprinted on the B-side surface.

10. The method of claim 9, wherein a temperature T2 of the texturing roller is actively controlled such that T2<T1.

11. The method of claim 9, wherein the texturing roller is stationary and the B-side surface of the glass substrate is tangential to the contact surface of the texturing roller when the B-side surface of the glass substrate contacts the contact surface of the texturing roller.

12. The method of claim 9, wherein the texturing roller is stationary and the B-side surface of the glass substrate is directed over the contact surface of the texturing roller such that the B-side surface has a contact angle with the contact surface of up to about 90°.

13. The method of claim 9, wherein the texturing roller is actively rotated as the glass substrate is drawn in the downward direction with pulling rollers.

14. The method of claim 5, wherein:
the glass substrate is formed by flowing the molten glass over only one side of an isopipe; and
the plurality of texturing features are formed by directing the glass substrate onto a landing extending from a root of the isopipe as the glass substrate is drawn in the downward direction, wherein the molten glass contacting the landing forms the texturing features in B-side surface of the glass substrate.

15. The method of claim 14, wherein at least a portion of a contact surface of the landing comprises a plurality of patterning features corresponding to the texturing features imprinted into the B-side surface.

16. The method of claim 5, wherein:
the glass substrate is formed by flowing the molten glass over a first side of an isopipe and a second side of the isopipe such that the molten glass rejoins at a root of the isopipe, wherein the second side of the isopipe comprises a plurality of patterning features corresponding to the texturing features imprinted into the B-side surface of the glass substrate; and
the plurality of texturing features are formed in the B-side surface of the glass substrate as the molten glass flows over the second side of the isopipe and the patterning features disrupt the flow of molten glass over the second side of the isopipe.

17. The method of claim 5, wherein:
the plurality of texturing features are formed in the B-side surface of the glass substrate by directing a beam of at least one laser source onto the B-side surface of the glass substrate such that the beam of the at least one laser source imprints the plurality of texturing features into the B-side surface of the glass substrate without ablating glass from the glass substrate as the glass substrate is drawn in the downward direction.

* * * * *